US007422926B2

United States Patent
Pellizzer et al.

(10) Patent No.: US 7,422,926 B2
(45) Date of Patent: Sep. 9, 2008

(54) SELF-ALIGNED PROCESS FOR MANUFACTURING PHASE CHANGE MEMORY CELLS

(75) Inventors: Fabio Pellizzer, Follina (IT); Roberto Bez, Milan (IT); Enrico Varesi, Milan (IT); Agostino Pirovano, Corbetta (IT); Pietro Petruzza, Pessano Con Bornago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 20 days.

(21) Appl. No.: 11/445,924

(22) Filed: Jun. 2, 2006

(65) Prior Publication Data
US 2007/0020797 A1    Jan. 25, 2007

(30) Foreign Application Priority Data
Jun. 3, 2005    (EP)    .................... 05104879

(51) Int. Cl.
*H01L 21/00* (2006.01)
(52) U.S. Cl. .......................... 438/95; 257/42
(58) Field of Classification Search .................. 438/95
See application file for complete search history.

(56) References Cited

U.S. PATENT DOCUMENTS

| 5,998,244 | A | * | 12/1999 | Wolstenholme et al. | ...... 438/128 |
| 6,579,760 | B1 | | 6/2003 | Lung | .......................... 438/257 |
| 2003/0186481 | A1 | | 10/2003 | Lung | .......................... 438/95 |
| 2004/0211953 | A1 | * | 10/2004 | Khouri et al. | .................. 257/2 |
| 2006/0091492 | A1 | * | 5/2006 | Lee et al. | ..................... 257/467 |
| 2007/0045606 | A1 | * | 3/2007 | Magistretti et al. | ............. 257/4 |

FOREIGN PATENT DOCUMENTS

| EP | 0 144 604 A2 | 6/1985 |
| EP | 1 469 532 A1 | 10/2004 |
| JP | 2005-71500 | 3/2005 |
| WO | WO 2004/021358 A1 | 3/2004 |
| WO | WO 2005/017906 A1 | 2/2005 |

* cited by examiner

*Primary Examiner*—Thao X. Le
*Assistant Examiner*—Kimberly Trice
(74) *Attorney, Agent, or Firm*—Lisa K. Jorgenson; Robert Iannucci; Seed IP Law Group PLLC

(57) ABSTRACT

A process for manufacturing phase change memory cells includes the step of forming a heater element in a semiconductor wafer and a storage region of a phase change material on and in contact with the heater element. In order to form the heater element and the phase change storage region a heater structure is first formed and a phase change layer is deposited on and in contact with the heater structure. Then, the phase change layer and the heater structure are defined by subsequent self-aligned etch steps.

18 Claims, 9 Drawing Sheets

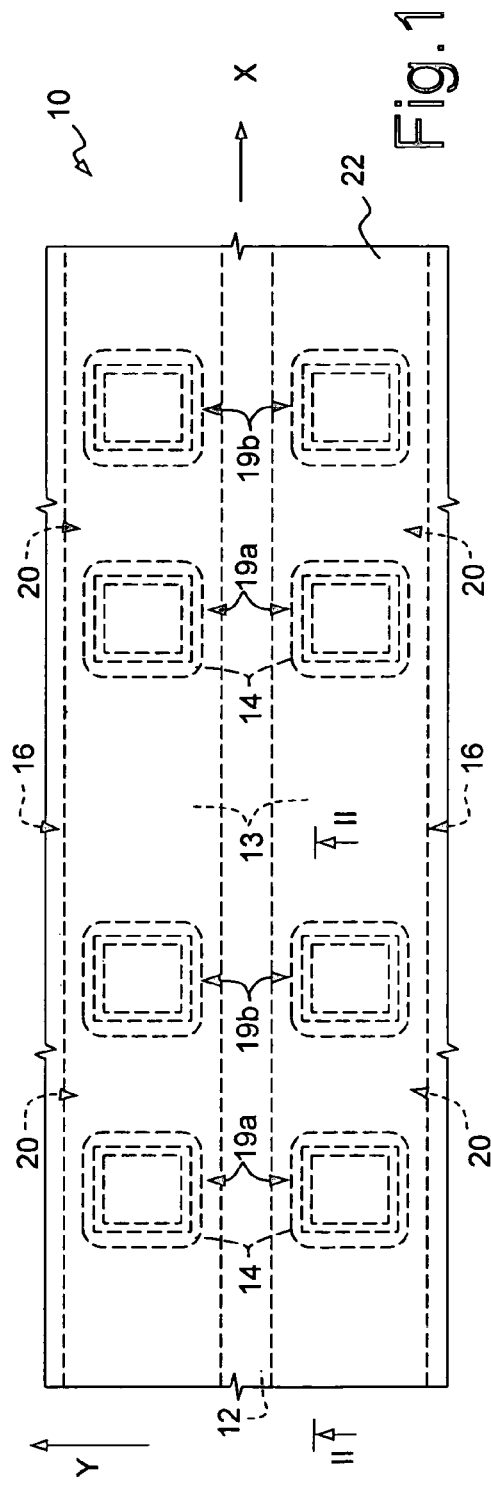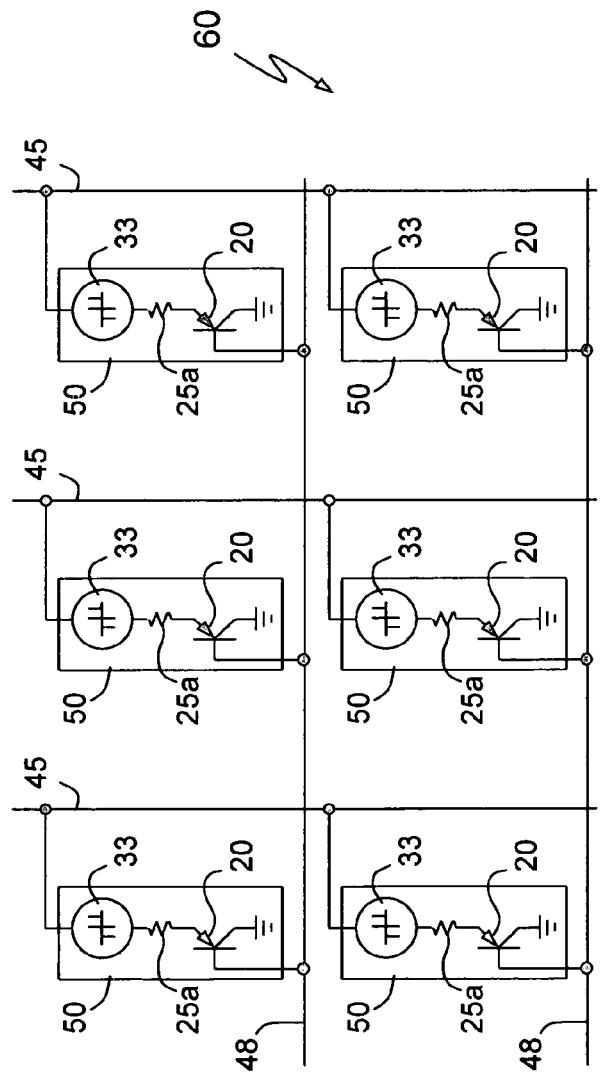

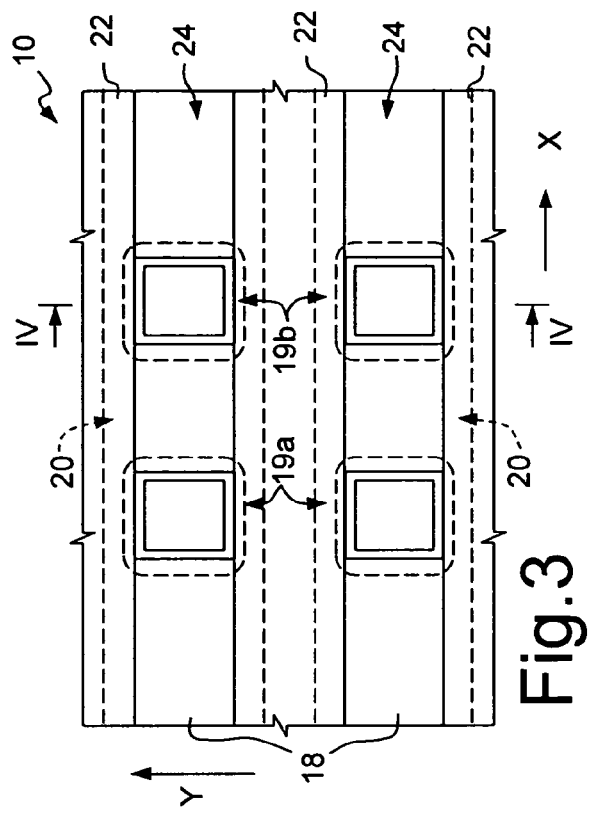
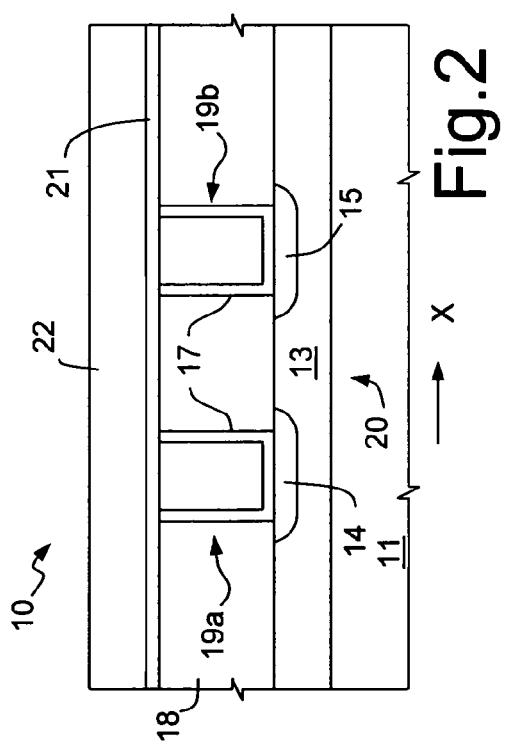
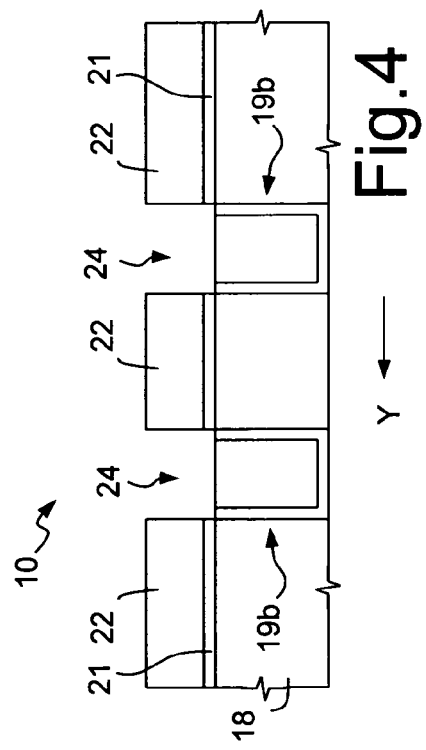

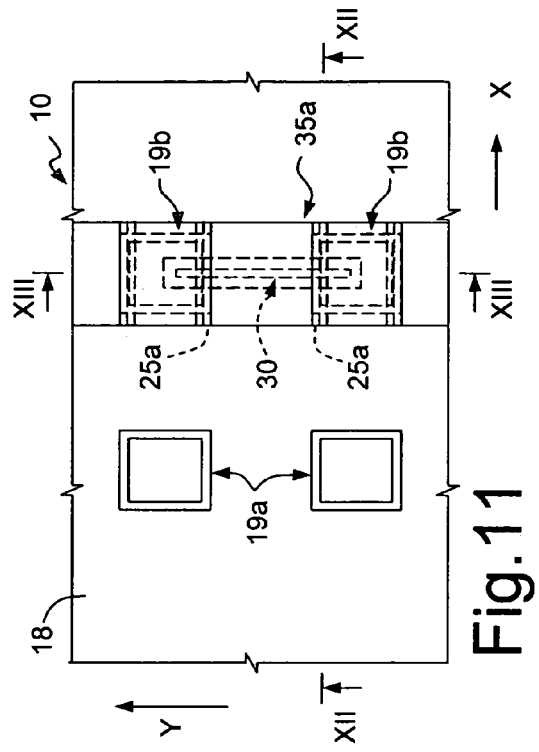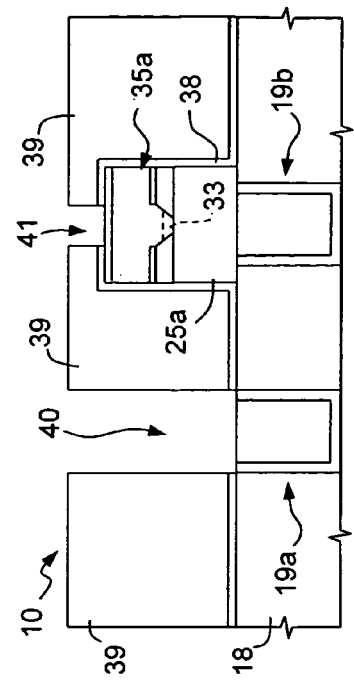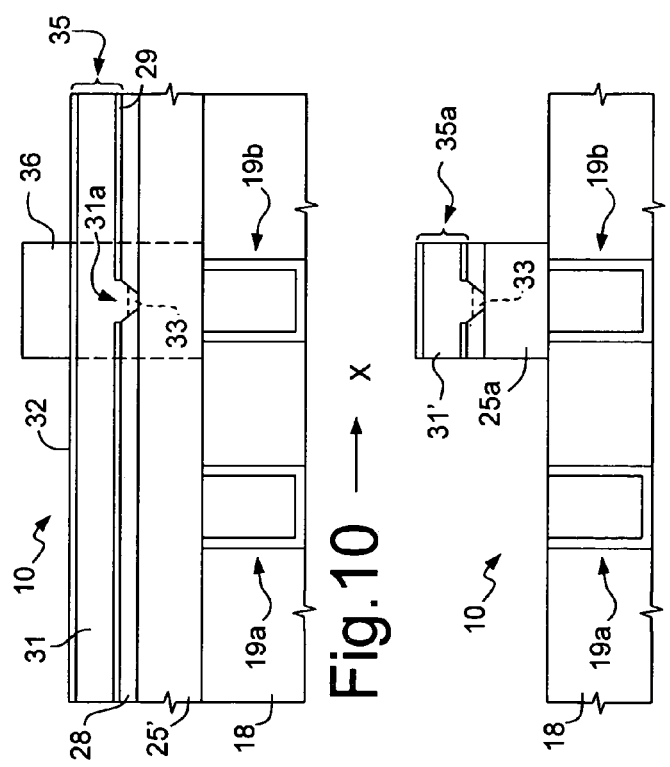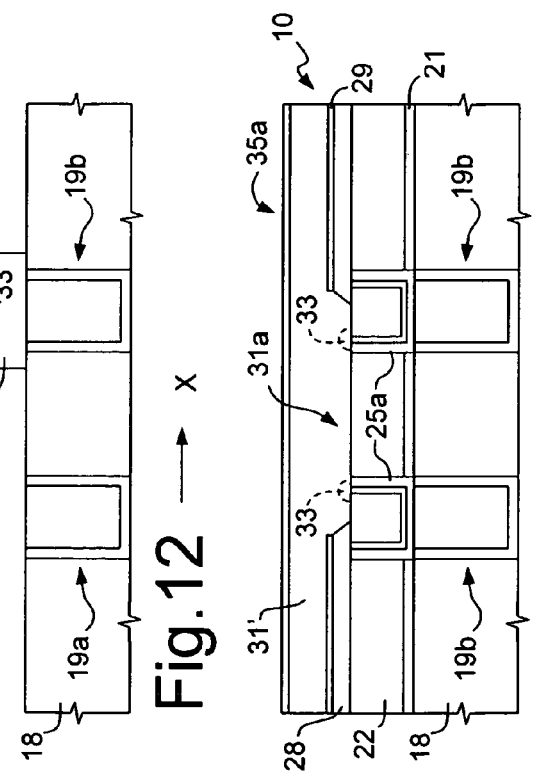

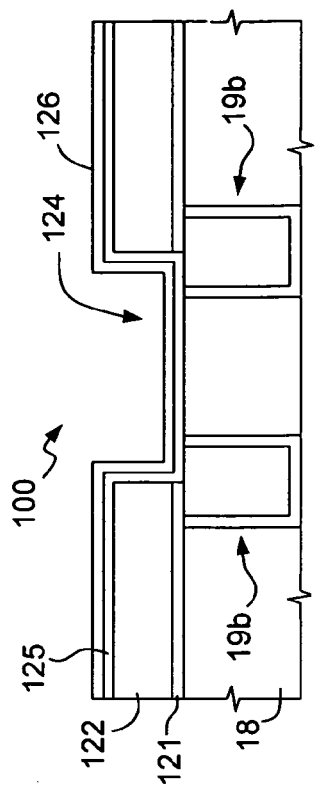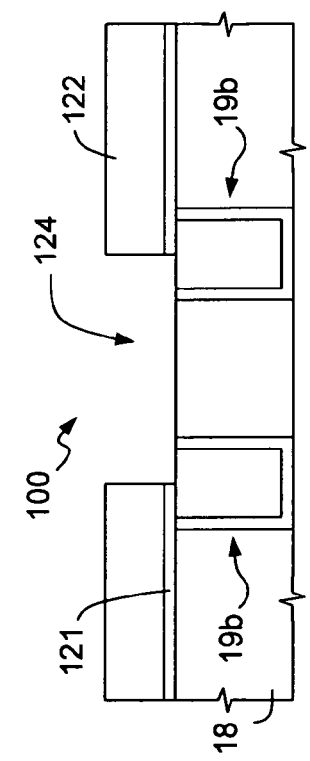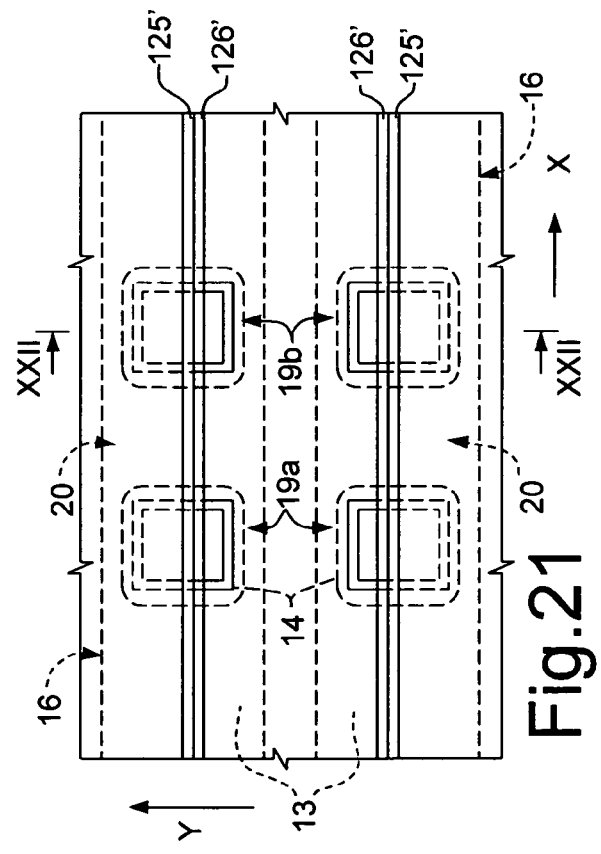

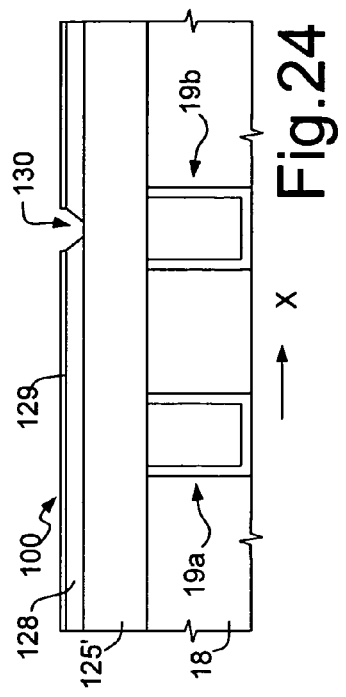
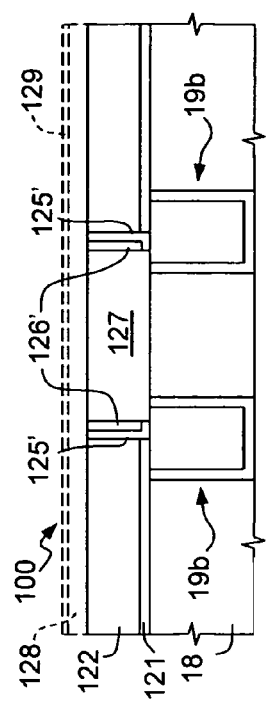
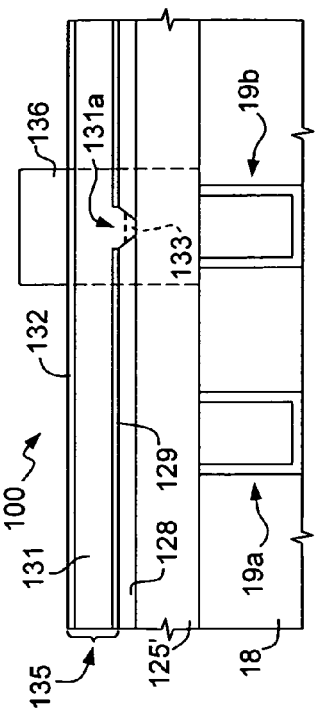
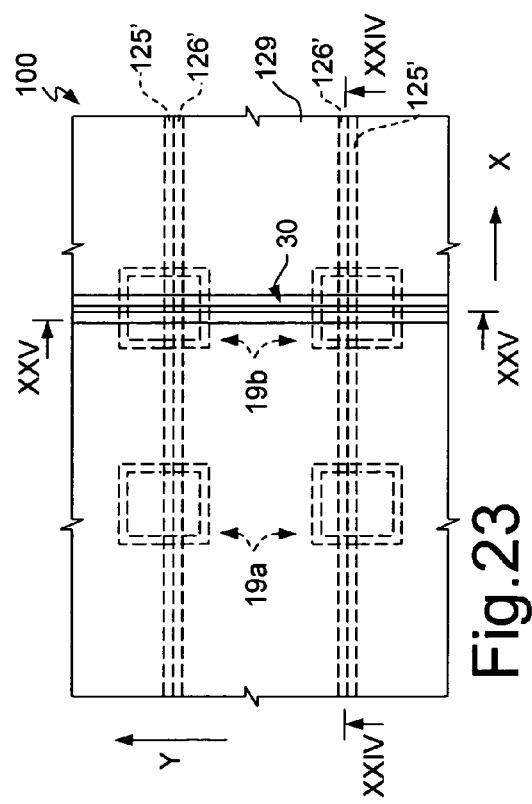
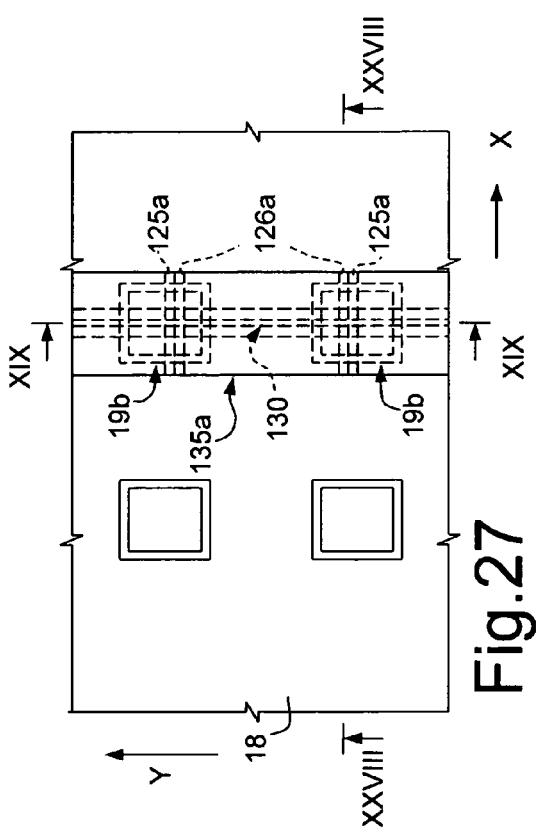

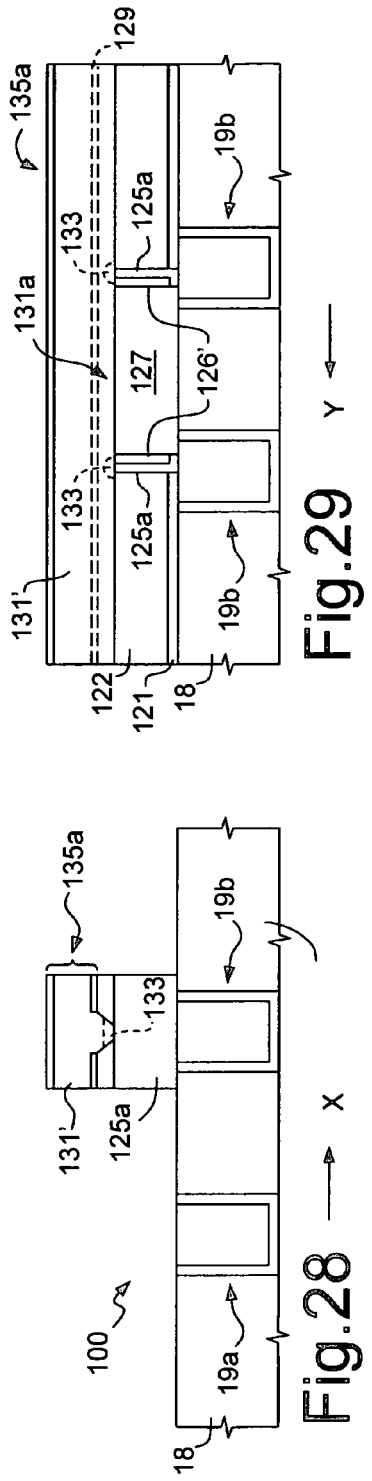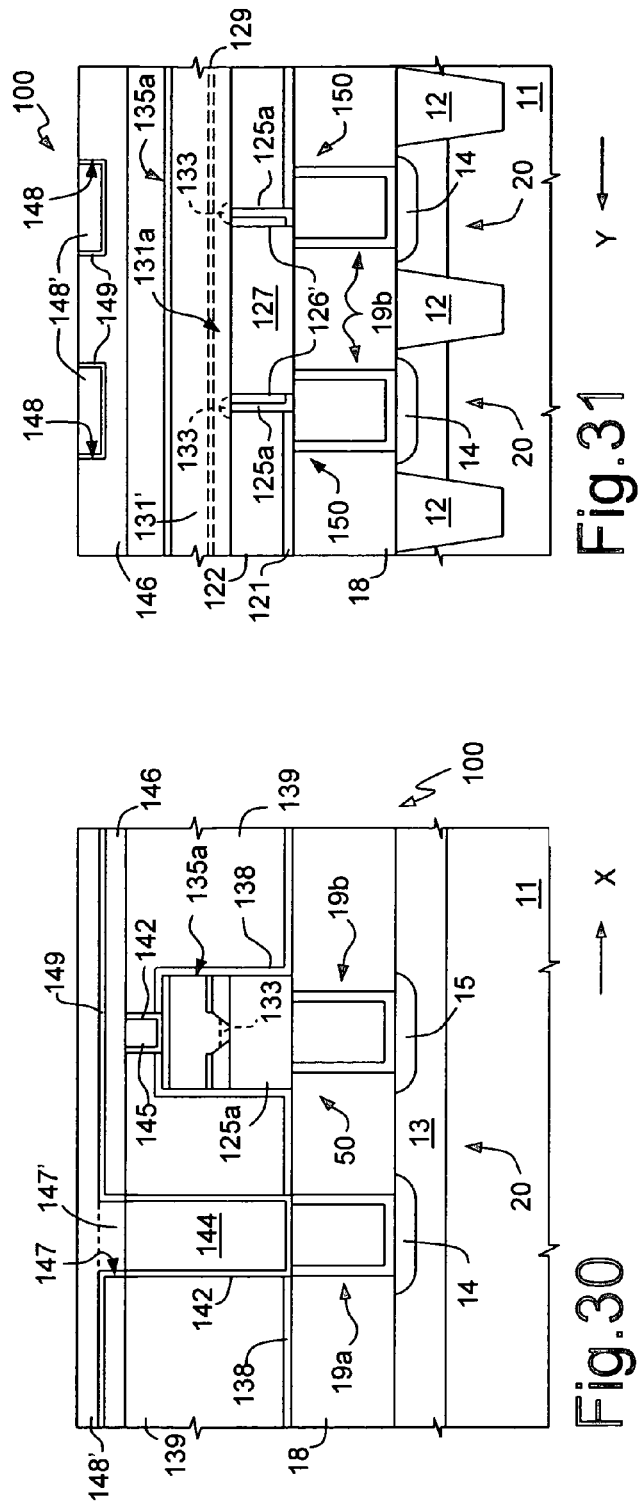

SELF-ALIGNED PROCESS FOR MANUFACTURING PHASE CHANGE MEMORY CELLS

BACKGROUND OF THE INVENTION

1. Field of the Invention

The present invention relates to a self-aligned process for manufacturing phase change memory cells.

2. Description of the Related Art

As is known, phase change memories use a class of materials that have the property of switching between two phases having distinct electrical characteristics, associated to two different crystallographic structures of the material, and precisely an amorphous, disorderly phase and a crystalline or polycrystalline, orderly phase. The two phases are hence associated to resistivities of considerably different values.

Currently, the alloys of elements of group VI of the periodic table, such as Te or Se, referred to as chalcogenides or chalcogenic materials, can be used advantageously in phase change memory cells. The currently most promising chalcogenide is formed from an alloy of Ge, Sb and Te ($Ge_2Sb_2Te_5$), which is now widely used for storing information on overwritable disks and has been also proposed for mass storage.

In the chalcogenides, the resistivity varies by two or more orders of magnitude when the material passes from the amorphous (more resistive) phase to the crystalline (more conductive) phase, and vice versa.

Phase change can be obtained by locally increasing the temperature. Below 150° C., both phases are stable. Starting from an amorphous state, and rising the temperature above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then rapidly cool off the chalcogenide.

Memory devices exploiting the properties of chalcogenic material (also called phase change memory devices) have been already proposed.

In a phase change memory including chalcogenic elements as storage elements, a plurality of memory cells are arranged in rows and columns to form an array. Each memory cell is coupled to a respective selection element, which may be implemented by any switching device, such as a PN diode, a bipolar junction transistor or a MOS transistor, and includes a chalcogenic region of a chalcogenide material in contact with a resistive electrode, also called heater. A storage element is formed at a contact area between the chalcogenide region and the heater. The heater is connected to a conduction terminal of the selection element.

In fact, from an electrical point of view, the crystallization temperature and the melting temperature are obtained by causing an electric current to flow through the resistive electrode in contact or close proximity with the chalcogenic material and thus heating the chalcogenic material by Joule effect.

In particular, when the chalcogenic material is in the amorphous, high resistivity state (also called the reset state), it is necessary to apply a voltage/current pulse of a suitable length and amplitude and allow the chalcogenic material to cool slowly. In this condition, the chalcogenic material changes its state and switches from a high resistivity to a low resistivity state (also called the set state).

Vice versa, when the chalcogenic material is in the set state, it is necessary to apply a voltage/current pulse of suitable length and high amplitude so as to cause the chalcogenic material to switch to the amorphous phase.

Several processes for manufacturing phase change memory cells and devices have been proposed so far, which, however, suffer from some limitations. In particular, known methods normally require several separate alignment steps to form the selection elements, the heaters, the chalcogenic regions and contacts for connecting the selection elements and the storage elements to word lines and bit lines.

In fact, the heaters are first aligned on conduction contacts of respective selection elements. Since minimization of the contact area between the heaters and the chalcogenic regions is a primary requirement in phase change memory cells, the heaters are normally in the form of walls or rods having sublithographic cross dimensions, i.e., thickness or diameter ("sublithographic" means here a linear dimension smaller than the minimum dimension achievable with current UV lithographic techniques, and hence smaller than 100 nm, down to approximately 5-20 nm). Structures having such a small dimension are made by controlled layer deposition steps. Thus, fabrication of the heaters includes depositing a dielectric layer on the conduction contacts, forming respective separate apertures in the dielectric layer on each conduction contact and aligned therewith, depositing a thin (sublithographic) layer of resistive material and possibly filling the apertures by a further dielectric material.

Then, a special mold layer is formed, having slits of sublithographic width on and across the heaters. The slits are filled by depositing a chalcogenic layer to make the storage elements. Hence, forming the mold layer uses a second alignment step.

A third alignment step is used to shape the chalcogenic layer and define resistive bit lines which connect storage elements arranged along the same array column.

Finally, bit lines, word line plugs and word lines are formed. The word line plugs must be aligned with control contacts of respective selection elements and the conductive bit lines are to be formed on resistive bit lines. Thereby, a fourth separate alignment step is involved.

Alignment of the heaters, of the resistive bit lines and of the word line plugs is particularly critical, because the effect of repeated alignment errors may lead to short circuits. As a result, an additional safety margin must be provided for and the cell area, as well as the array density, may not be optimized.

BRIEF SUMMARY OF THE INVENTION

One embodiment of the invention provides an improved manufacturing process which is free from the above-described drawbacks.

According to one embodiment of the invention, there is provided a process for manufacturing phase change memory cells as defined in claim 1. The process includes forming a heater element in a semiconductor wafer and a storage region of a phase change material on and in contact with said heater element. The process of forming said heater element and said phase change storage region includes forming a heater structure and a phase change layer on and in contact with said heater structure. The heater structure and the phase change layer are then defined by subsequent self-aligned etch steps.

BRIEF DESCRIPTION OF THE SEVERAL VIEWS OF THE DRAWING(S)

For the understanding of the present invention, preferred embodiments thereof are now described, purely as non-limitative examples, with reference to the enclosed drawings, wherein:

FIG. 1 is a top plan view of a semiconductor wafer in an initial step of a manufacturing process according to a first embodiment of the present invention;

FIG. 2 is a cross section through the wafer of FIG. 1, taken along the line II-II of FIG. 1;

FIG. 3 is a top plan view of a portion of the wafer of FIGS. 1 and 2, in a subsequent manufacturing step;

FIG. 4 is a cross section through the wafer of FIG. 3, taken along the line IV-IV of FIG. 3;

FIG. 10 shows the same view as FIG. 9, in a subsequent manufacturing step;

FIG. 11 is a top plan view of the wafer of FIG. 10, in a subsequent manufacturing step;

FIGS. 12 and 13 are cross sections through the wafer of FIG. 11, taken along the lines XII-XII and XII-XII of FIG. 11, respectively;

FIG. 14 shows the same view as FIG. 12, in a subsequent manufacturing step;

FIG. 17 is a simplified circuital diagram of a phase change memory device including phase change memory made by the process illustrated in FIGS. 1-16;

FIG. 19 is a cross section through the wafer of FIG. 18, taken along the line XIX-XIX of FIG. 18;

FIG. 20 shows the same view as FIG. 19, in a subsequent manufacturing step;

FIG. 21 is a top plan view of the wafer of FIG. 20, in a subsequent manufacturing step;

FIG. 22 is a cross section through the wafer of FIG. 21, taken along the line XXII-XXII of FIG. 21;

FIG. 23 is a top plan view of the wafer of FIGS. 20 and 21, in a subsequent manufacturing step;

FIGS. 24 and 25 are cross sections through the wafer of FIG. 23, taken along the lines XXIV-XXIV and XXV-XXV of FIG. 23, respectively;

FIG. 26 shows the same view as FIG. 24, in a subsequent manufacturing step;

FIG. 27 is a top plan view of the wafer of FIG. 26, in a subsequent manufacturing step;

FIGS. 28 and 29 are cross sections through the wafer of FIG. 27, taken along the lines XXVIII-XXVIII and XXIX-XXIX of FIG. 27, respectively;

FIGS. 30 and 31 are cross sections through the wafer of FIGS. 18-29 in a final manufacturing step, taken along the lines XXVIII-XXVIII and XXIX-XXIX of FIG. 27, respectively.

DETAILED DESCRIPTION OF THE INVENTION

Figure 6:
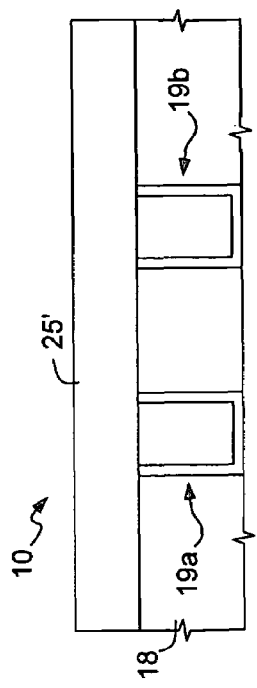
FIGS. 6 and 7 are cross sections through the wafer of FIG. 5, taken along the lines VI-VI and VII-VII of FIG. 5, respectively.

With reference to FIGS. 1 and 2, initially a wafer 10 comprising a substrate 11, of P-type, is subjected to standard front end steps. In particular, inside the substrate 11 insulation regions 12 are formed and delimit active areas 16; then base regions 13 of N-type are implanted. Next, a first dielectric layer 18 is deposited and planarized; openings are formed in the first dielectric layer 18 above the base regions 13. At this point, using two dedicated masks and exploiting the self-alignment in the openings, base contact regions 14, of $N^+$-type, and emitter regions 15, of $P^+$-type, are implanted. Then the openings in the first dielectric layer 18 are covered by a barrier layer 17, for example a Ti/TiN layer, before being filled with tungsten to form base contacts 19a and emitter contacts 19b. The base contacts 19a are thus in direct electrical contact with the base regions 13, and the emitter contacts 19b are in direct electrical contact with the emitter regions 15. The base regions 13, base contact regions 14, emitter regions 15 and the substrate 11 (intrinsic collector) form selection transistors 20 for the memory cells. The base contact regions 14, emitter regions 15, base contacts 19a and emitter contacts 19b of each selection transistor 20 are aligned according to a row direction X. Adjacent selection transistors 20 are aligned according to the row direction X (to form rows of an array) and to a column direction Y, perpendicular to the row direction X (to form columns of the array). Moreover, the active areas 16 and the base regions 13 extend continuously according to the row direction and adjacent selection transistors 20 according to the row direction X share the same base regions 13. For the sake of simplicity, FIG. 1 shows only four adjacent selection transistors 20, aligned in couples according to the row direction X and to column direction Y; in FIG. 2 only one selection transistor 20 is illustrated. Once the selection transistors 20, the base contacts 19a and the emitter contacts 19b have been completed, then a silicon nitride layer 21 and a second dielectric layer 22 are deposited on the wafer 10. In this way, the structure of FIGS. 1 and 2 is obtained.

Then, FIGS. 3 and 4, heater trenches 24 are opened in the second dielectric layer 22 and in the silicon nitride 21. The heater trenches 24 are substantially rectilinear and extend in the row direction X continuously above respective rows of selection transistors 20. Therefore, base contacts 19a and emitter contacts 19b of each selection transistor 20 are exposed. Moreover, the heater trenches 24 have approximately the same width in the column direction Y as the base contacts 19a and the emitter contacts 19b. However, the heater trenches 24 may be either narrower or wider, provided that each heater trench 24 exposes the base contacts 19a and the emitter contacts 19b of a single row of selection transistors 20.

Figure 7:
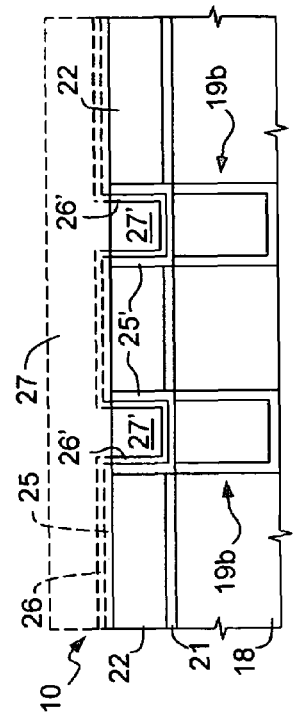
Figure 5:
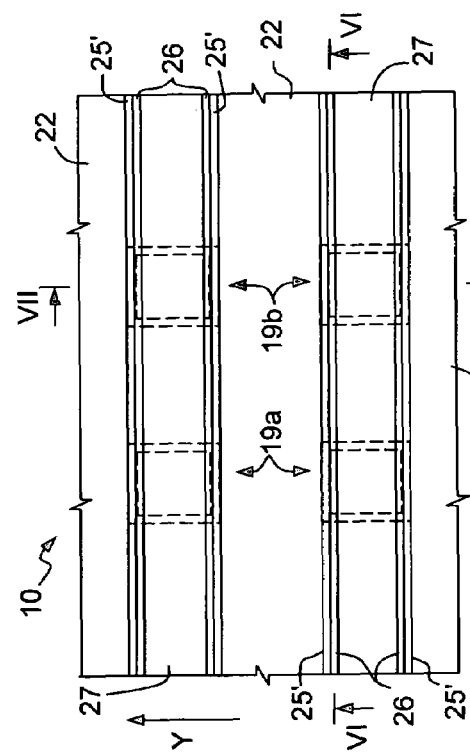
FIG. 5 is a top plan view of the wafer of FIGS. 3 and 4, in a subsequent manufacturing step.

With reference to FIGS. 5-7, heater structures 25' are formed in the heaters trenches 24 by conformally depositing a heater layer 25 and, optionally, a dielectric sheath layer 26 (illustrated by dashed lines in FIG. 7 only, for simplicity), both having a controlled sublithographic thickness, by filling the heater trenches 24 with a dielectric filling layer 27, and by removing materials exceeding the heater trenches 24 from above the wafer 10 by CMP (Chemical-Mechanical Polishing). The heater structures 25' are made of a resistive material and have a sublithographic thickness, preferably in the range of 5-20 nm. Hereinafter, the term "sublithographic" means a linear dimension smaller than the minimum dimension achievable with current optical (UV) lithographic techniques, and hence smaller than 100 nm, preferably less than 50-60 nm, down to approximately 5-20 nm. As illustrated in FIG. 5-7, the heater structures 25' are in the form of elongated elements, having U-shaped cross section and running parallel to the row direction X. Sheath portions 26', which are made from residual portions of the sheath layer, internally coat the heater structures 25' and are filled with filling portions 27' of the dielectric filling layer 27, not removed during CMP step.

Figure 9:
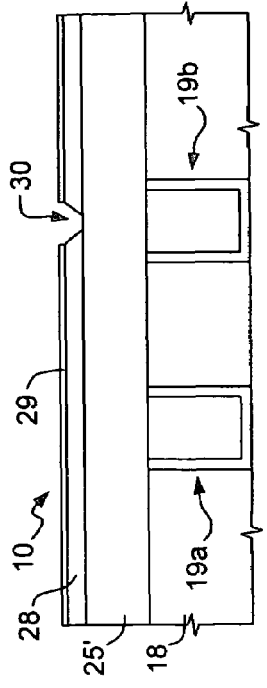
FIG. 9 is a cross section through the wafer of FIG. 8, taken along the line IX-IX of FIG. 8.
Figure 8:
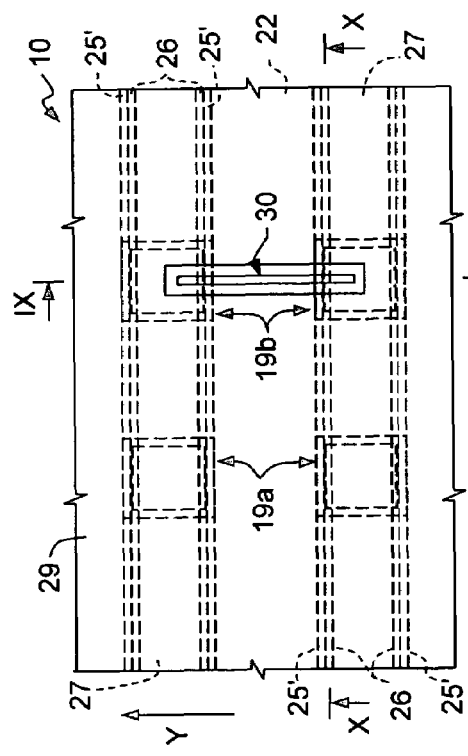
FIG. 8 is a top plan view of the wafer of FIGS. 5-7, in a subsequent manufacturing step.

After planarization of the wafer 10, a mold layer 28, of silicon nitride, and, optionally, an adhesion layer 29, e.g., of Ti, TiSiN or Si, are deposited and microtrenches 30 are formed therein (see FIGS. 8 and 9). More precisely, microtrenches 30 are in the form of elongated slits, parallel to the column direction Y and having a sublithographic bottom cross dimension according to the row direction X. Preferably, microtrenches 30 longitudinally extend across facing vertical walls of two adjacent heater structures 25', as shown in FIG. 8.

Any suitable known method may be used to form the microtrenches 30. For instance, slits of lithographic dimensions may be first opened by a lithographic process; then, a spacers layer (not shown) of controlled thickness is conformally deposited and etched back, to form spacers within the slits and narrowing the (bottom) width thereof down to the desired sublithographic range.

As illustrated in FIG. 10, a chalcogenic layer 31, e.g., of GST (Ge2Sb2Te5), and a first barrier layer 32, preferably of Ti/TiN, are deposited on the adhesion layer 29, so that the chalcogenic layer 31 fills the microtrenches 30 with storage portions 31a. Storage elements 33 are thus defined at intersections between storage portions 31a and respective heater structures 25'. Contact areas between the storage portions 31a of the chalcogenic layer 31 and the heater structures 25' have sublithographic cross dimensions both in the column direction Y (because of the sublithographic thickness of the heater structures 25') and in the row direction X (because of the sublithographic bottom width of the microtrenches 30). The adhesion layer 29, the chalcogenic layer 31 and the first barrier layer 32 form a resistive bit line stack 35.

A mask 36 is then formed on the wafer 10 and includes strips running parallel to the column direction Y and arranged above the microtrenches 30. The mask 36 is used to define the resistive bit line stack 35, the heater structures 25', with the sheath portions 26' and the filling portions 27' contained therein, the second dielectric layer 22 and the silicon nitride layer 21 by a sequence of selective, self aligned etch steps. Hereinafter, "self-aligned etch steps" means that subsequent etch steps are carried out for removing portions of several stacked layers or structures of different materials, and the lower layers or structures, which are etched later, are defined based on the shape of the upper layers or structures, which have already been etched. Hence, only the mask 36 need to be aligned with the underlying structures. The sequence of etch steps is terminated on reaching the first dielectric layer 18.

Thereby, heaters 25a and resistive bit lines 35a are made from the heater structures 25' and the resistive bit line stack 35, respectively (see FIGS. 11-13, where the mask 36 has been already removed). Due to self aligned etch steps, the heaters 25a and the resistive bit lines 35a have the same dimension according to the row direction X. The heaters 25a are in the form of U-shaped bodies having vertical walls and bottom portions directly arranged on the emitter contacts 19b of respective selection transistors 20 (here not shown). The resistive bit lines 35a include respective residual portions 31' of the chalcogenic layer 31 and mutually connect storage portions 31a, which are aligned according to the column direction Y. Moreover, each storage portion 31a forms two storage elements 33 at intersections with facing vertical walls of two adjacent heaters 25a, aligned according to the column direction Y. Each heater 25a is in contact with a single respective storage portion 31a (in other words, one of the vertical walls of each heater 25a is exclusively in contact with the mold layer 28).

Figure 16:
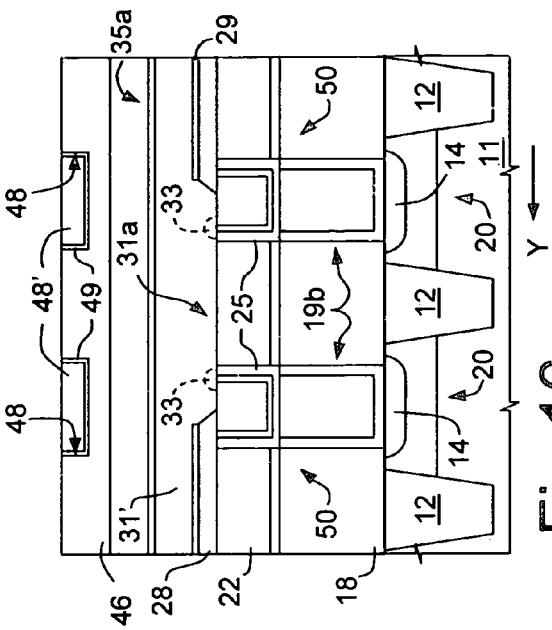
FIGS. 15 and 16 are cross sections through the wafer of FIGS. 1-14 in a final manufacturing step, taken along the lines XII-XII and XII-XII of FIG. 11, respectively.
Figure 15:
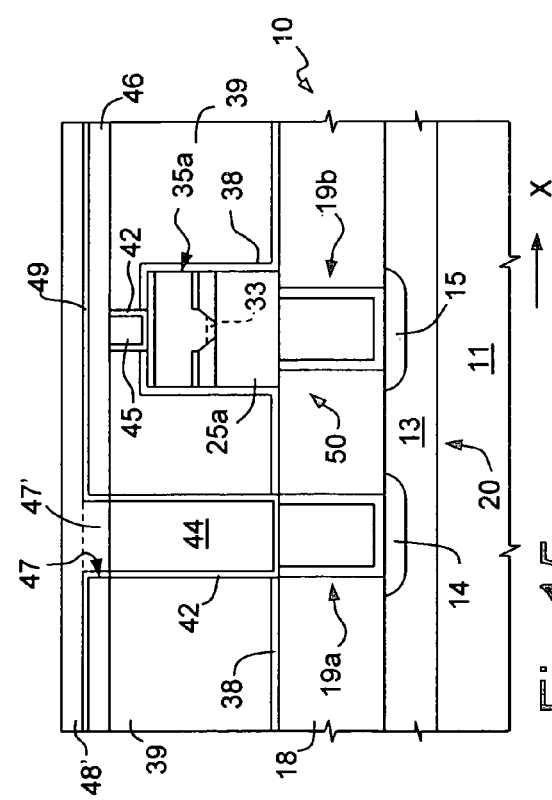

Then, FIG. 14, a sealing layer 38, of silicon nitride, and a third dielectric layer 39, of silicon dioxide, are deposited on the wafer 10, planarized and etched to open base plug holes 40 and metal bit line trenches 41. Base contacts 19a and resistive bit lines 35a are thus exposed again. The base plug holes 40 and the metal bit line trenches 41 are coated by a second barrier layer 42, of TaN/Ta, and filled with Cu; and the wafer 10 is planarized by CMP to remove Cu and TaN/Ta deposited outside the base plug holes 40 and the metal bit line trenches 41. Base plugs 44 and metal bit lines 45 are thus made, as shown in FIG. 15 (Cu-damascene technique). The base plugs 44 are directly in contact with respective base contacts 19a; and the metal bit lines 45 are formed on and parallel to respective resistive bit lines 35a. Finally, a fourth dielectric layer 46 is deposited and etched to expose the base plugs 44 through holes 47 and to open word line trenches 48, extending in the row direction X. The holes 47 and the word line trenches 48 are coated by a third barrier layer 49, of TaN/Ta, and filled with Cu; and the wafer 10 is planarized by CMP to remove Cu and TaN/Ta deposited outside the holes 47 and the word line trenches 48. Plugs 47' and metal word lines 48' are thus made, as shown in FIG. 15 (further Cu-damascene technique). Phase change memory cells 50 are thus completed, as illustrated in FIGS. 15 and 16. In particular, each of the phase change memory cells 50 includes one respective storage element 33 and the corresponding heater 25a and selection transistor 20. Process flow in then completed with all the necessary metal levels (not shown).

As illustrated in FIG. 17, phase change memory cells 50 are arranged in rows and columns to form a phase change memory device 60, which further includes known control, reading and programming circuits (here not shown). In particular, FIG. 17 shows portions of three columns, with the respective metal bit lines 45, and of two rows, with the respective word lines 48'.

The process described above has several advantages. First, a better alignment margin is provided, because the heaters 25a and the resistive bit lines 35a are made by self aligned etch steps. Thus, only one alignment step is required, for the mask 36. Any risks of accidental contacts of the base plugs 44 and the resistive bit lines 35a or the heaters 25a are thus virtually eliminated. Alignment of the heater trenches 24 on the emitter contacts 19b is not a difficult task: in fact, it is enough to provide sufficient mutual contact area and precision is not a primary requirement. In the end, higher memory density and smaller memory devices may be achieved. Moreover, the lithographic process for opening the heater trenches 24, as well as the subsequent filling step are greatly simplified (only quite large continuous rectilinear trenches need to be opened and filled). Further advantages reside in that opening the base plug holes 41 requires etching only one nitride layer instead of two.

A second embodiment of the invention is illustrated in FIGS. 18-31, where parts already shown are designated by the same reference numbers.

Figure 18:
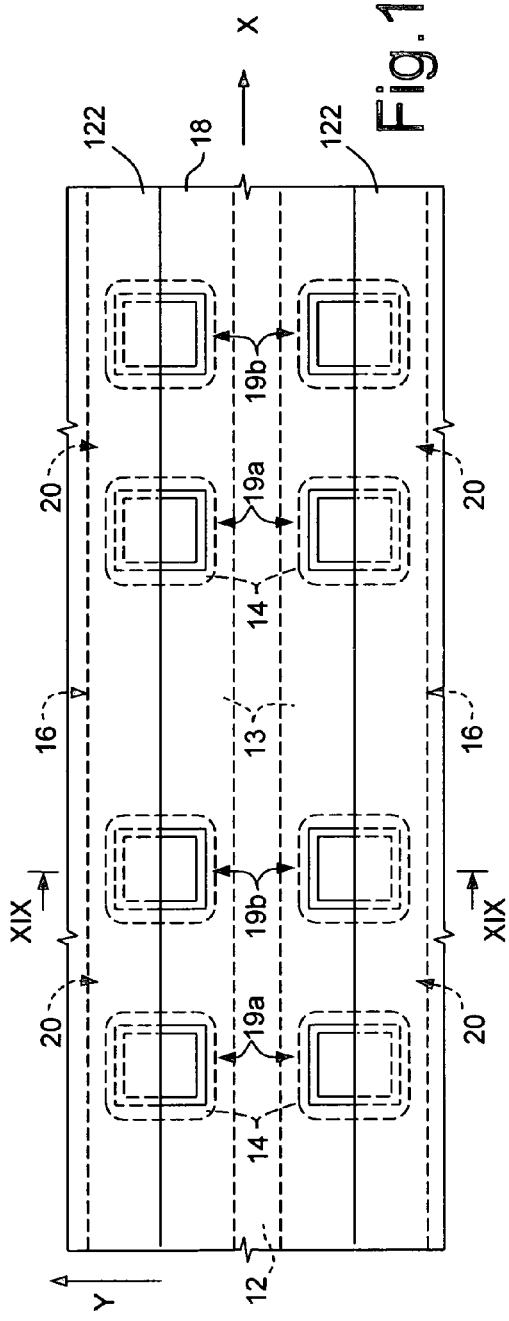
FIG. 18 is a top plan view of a semiconductor wafer in an initial step of a manufacturing process according to a second embodiment of the present invention.

In a semiconductor wafer 100, selection transistors 20, with respective base contacts 19a and emitter contacts 19b, are initially made in active areas 16. Selection transistors 20 are aligned according to the row direction X (to form rows of an array) and to the column direction Y (to form columns of the array). A silicon nitride layer 121 and a second dielectric layer 122 are deposited on the wafer 100 and subsequently etched to open heater trenches 124, which run indefinitely parallel to the row direction X. The structure of FIGS. 18 and 19 is thus obtained. Each heater trench 124 partially exposes base contacts 19a and emitter contacts 19b of selection transistors 20 arranged in two adjacent rows. For example, each heater trench 124 is as wide (according to column direction Y) as to expose approximately half of the base contacts 19a and emitter contacts 19b of the two adjacent rows of selection transistors 20, whereas remaining portions thereof are still protected by the silicon nitride layer 121 and the second dielectric layer 122.

Then, FIG. 20, a heater layer 125 and, optionally, a dielectric sheath layer 126, both having sublithographic thickness, are conformally deposited on the wafer 100. Preferably, the thickness of the heater layer 125 is in the range of 5-20 nm.

The heater layer 125 and the sheath layer 126 are etched back and flat portions thereof are removed from the bottom of the heater trench 124, as illustrated in FIGS. 21 and 22. In practice, vertical portions of the heater layer 125 and of the sheath layer 126 adhering to sides of the heater trenches 124 are separated from each other and define heater structures 125' and sheath portions 126', respectively. Therefore, the second dielectric layer 122 outside the heater trenches 124, and the first dielectric layer 18, the base contacts 19a and the emitter contacts 19b inside the heater trenches 124 are exposed again. The heater structures 125' are in the form of rectilinear vertical walls, running parallel to the row direction X and having small lateral protrusions at bottom. In practice, two separate heater structures 125' are obtained from the heater layer 125 in each heater trench 124; each of the heater structures 125' extends on a respective row of selection transistors 20 and is isolated from any other heater structures 125' of the wafer 100. A filling layer (not shown) is deposited on the wafer 100 and removed from outside the heater trenches 124 by CMP. Hence, the heater trenches 124 are filled by filling portions 127 of the filling layer, illustrated by a dashed line in FIG. 22.

A mold layer 128, of silicon nitride, and, optionally, an adhesion layer 129, e.g., of Ti, TiSiN or Si, are deposited and microtrenches 130 are formed therein (see FIGS. 23-25). More precisely, microtrenches 30 are in the form of elongated slits, running across all rows and parallel to the column direction Y and having a sublithographic bottom width according to the row direction X. The microtrenches 130 extend across the heater structures 125' and above the emitter contacts 19b of transistors 20 (here not shown) aligned according to the column direction Y. Thus, sublithographic extensions of the heater structures 125' are exposed at intersections with the microtrenches 130.

As illustrated in FIG. 26, a chalcogenic layer 131, e.g., of GST (Ge2Sb2Te5), and a first barrier layer 132, of Ti/TiN, are deposited on the adhesion layer 129, so that the chalcogenic layer 131 fills the microtrenches 130 with storage portions 131a. Storage elements 133 are thus defined at intersections between storage portions 131a and respective heater structures 125'. Contact areas between the storage portions 131a of the chalcogenic layer 131 and the heater structures have sublithographic cross dimensions both in the column direction Y (because of the sublithographic thickness of the heater structures 125') and in the row direction X (because of the sublithographic bottom width of the microtrenches 130). The adhesion layer 129, the chalcogenic layer 131 and the first barrier layer 132 form a resistive bit line stack 135. A mask 136 is then formed on the wafer 100 and includes strips running parallel to the column direction Y and arranged above the microtrenches 130.

The resistive bit line stack 135, the mold layer 128, the heater structures 125, the sheath portions 126, the filling portions 127, the second dielectric layer 122 and the silicon nitride layer 121 are selectively and sequentially etched in subsequent self-aligned etch steps, using the mask 136.

Thus, heaters 125a and resistive bit lines 135a are made from the heater structures 125 and the resistive bit line stack 135, respectively (see FIGS. 27-29, where the mask 136 has been already removed). Due to self aligned etch steps, the heaters 125a and the resistive bit lines 135a have the same dimension according to the row direction X. The heaters 125a are in the form of vertical walls directly arranged on the emitter contacts 19b of respective selection transistors 20 (here not shown). The resistive bit lines 135a include respective residual portions 131' of the chalcogenic layer 131 and respective storage portions 131a. Moreover, storage portions 131a run parallel to the column direction Y and form storage elements 133 at intersections with heaters 125a, which are aligned under the storage portions 131a.

The process is terminated as already described and the structure of FIGS. 30 and 31 is obtained. In particular, a sealing layer 138, of silicon nitride, and a third dielectric layer 139, of silicon dioxide, are deposited on the wafer 10; base plugs 144 and metal bit lines 145 are made by a Cu-damascene technique, on the base contacts 19a and on resistive bit lines 135a, respectively. Finally, a fourth dielectric layer 146 is deposited and etched to expose the base plugs 144 through holes 147 and to open word line trenches 148 extending in the row direction X. The holes 147 and the metal word line trenches 148 are coated by a third barrier layer 149, of TaN/Ta, and filled with Cu; and the wafer 100 is planarized by CMP to remove Cu and TaN/Ta deposited outside the holes 147 and the word line trenches 148. Plugs 147' and metal word lines 148' are thus made, as shown in FIG. 30 (further Cu-damascene technique). Phase change memory cell 150 are thus completed, as illustrated in FIGS. 30 and 31. In particular, each of the phase change memory cells 150 includes one respective storage element 133 and the corresponding heater 125a and selection transistor 20. Process flow in then completed with all the necessary metal levels (not shown).

The process for manufacturing the phase change memory cells 150 has further advantages, especially in that opening the microtrenches, which include continuous slits crossing several heater structures, is simplified. Also depositing the heating layer and filling the heater trenches is simpler, because of the larger dimension thereof.

Figure 32:
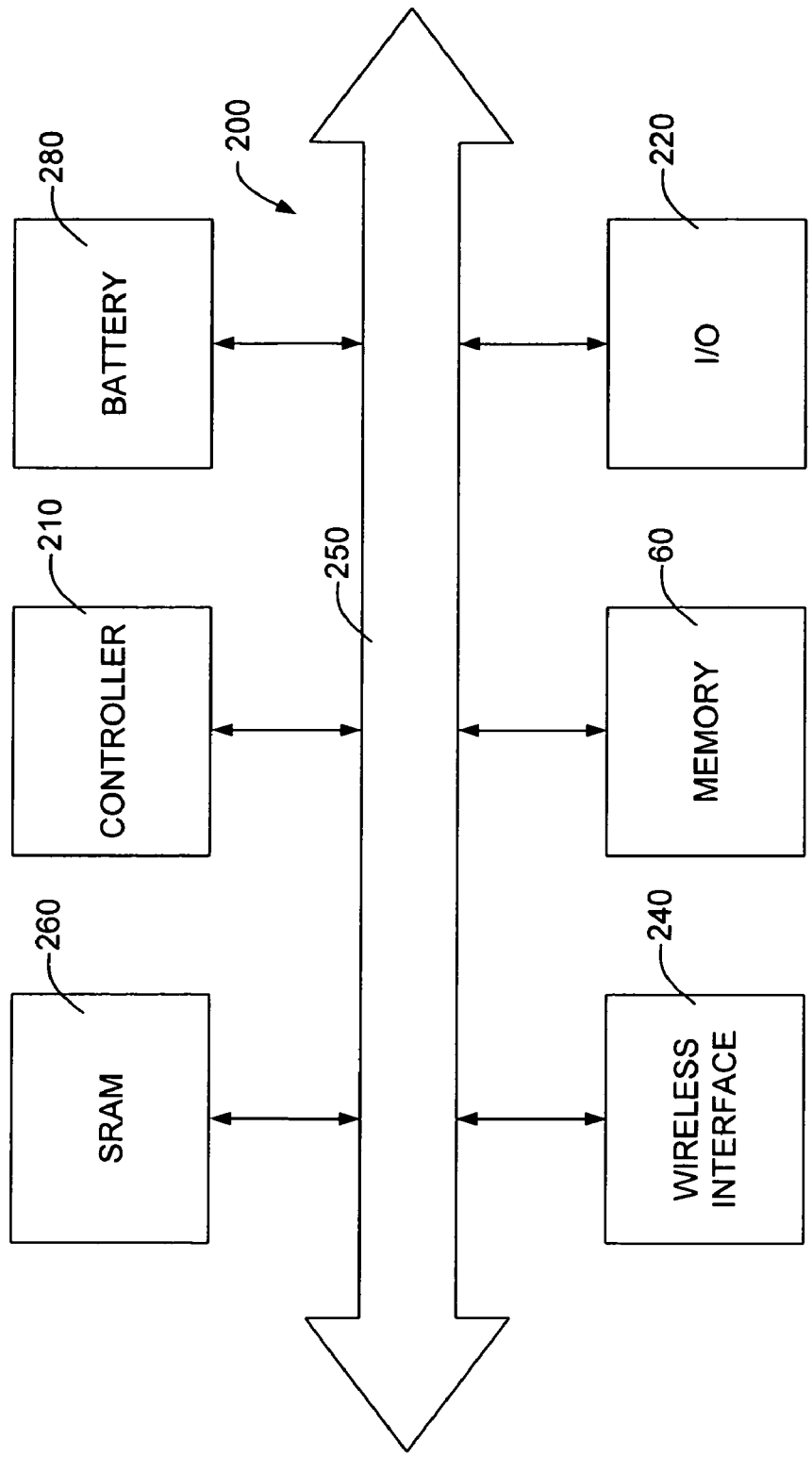
FIG. 32 is a is a system depiction of one embodiment of the present invention.

In FIG. 32, a portion of a system 200 in accordance with an embodiment of the present invention is described. System 200 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 200 may be used in any of the following systems: a wireless local area network (WLAN) system, a wireless personal area network (WPAN) system, or a cellular network, although the scope of the present invention is not limited in this respect.

System 200 may include a controller 210, an input/output (I/O) device 220 (e.g., a keypad, display), the phase change memory device 60, a wireless interface 240, and a static random access memory (SRAM) 260 and coupled to each other via a bus 250. A battery 280 may supply power to the system 200 in one embodiment. It should be noted that the scope of the present invention is not limited to embodiments having any or all of these components.

Controller 210 may comprise, for example, one or more microprocessors, digital signal processors, micro-controllers, or the like. The phase change memory device 60 may be used to store messages transmitted to or by system 200. The phase change memory device 60 may also optionally be used to store instructions that are executed by controller 210 during the operation of system 200, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information.

The I/O device 220 may be used to generate a message. The system 200 may use the wireless interface 240 to transmit and receive messages to and from a wireless communication network with a radio frequency (RF) signal. Examples of the wireless interface 240 may include an antenna, or a wireless transceiver, such as a dipole antenna, although the scope of the present invention is not limited in this respect. Also, the I/O device 220 may deliver a voltage reflecting what is stored as either a digital output (if digital information was stored), or as analog information (if analog information was stored).

While an example in a wireless application is provided above, embodiments of the present invention may also be used in non-wireless applications as well.

Finally, it is clear that numerous variations and modifications may be made to the process described and illustrated herein, all falling within the scope of the invention as defined in the attached claims.

The invention claimed is:

1. A process for manufacturing phase change memory cells, comprising:
    forming a heater element in a semiconductor wafer and a storage region of a phase change material on and in contact with said heater element; wherein said step of forming said heater element and said phase change storage region comprises:
        forming a heater structure and a phase change layer on and in contact with said heater structure; and
        defining said phase change layer and said heater structure by subsequent self-aligned etch steps in which the phase change layer is etched into an etched shape and the heater structure is defined, after the phase change layer is etched, based on the etched shape of the phase change layer, wherein said step of forming said heater element and said phase change storage region comprises:
    forming a dielectric layer on said wafer;
    forming at least a trench in said dielectric layer, said trench being elongated according to a first direction; and
    forming said heater structure within said trench.

2. A process according to claim 1, wherein said step of forming said heater structure within said trench includes conformally depositing a heater layer of a resistive material in said trench, said heater layer having a sublithographic thickness.

3. A process according to claim 2, wherein a plurality of phase change memory cells arranged in rows and columns are made, said rows extending according to said first direction, and wherein making each phase change memory cell includes forming a respective selection element in said wafer.

4. A process according to claim 3, wherein one said trench is formed for each row of said phase change memory cells, said trench continuously extending above selection elements aligned in a same row.

5. A process according to claim 3, comprising forming a plurality of trenches, wherein each of said trenches extends above two adjacent rows of said selection elements.

6. A process according to claim 5, wherein said trenches continuously extend in said first direction.

7. A process according to claim 5, wherein forming said heater structures within said trench comprises selectively removing first portions of said heater layer from bottom portions of said trenches, thereby separating second portions of said heater layer form each other, said second portions of said heater layer adhering to side walls of said trenches.

8. A process according to claim 1, comprising the step of depositing a structural layer on said heater structure and forming elongated openings extending across said heater structure in a second direction, transverse to said first direction.

9. A process according to claim 8, wherein said elongated openings include slits having a sublithographic width according to said first direction.

10. A process according to claim 9 wherein said slits extend across all rows in said second direction.

11. A process according to claim 8, wherein forming said phase change storage region comprises filling elongated openings by depositing said phase change layer on said structural layer.

12. A process according to claim 1, further comprising
    depositing a barrier layer above the phase change material;
    etching the barrier layer to remove a first portion thereof and to leave a second portion thereof; and
    using the second portion of the baffler layer as a mask to etch the phase change layer and the heater structure.

13. A process for manufacturing phase change memory cells comprising:
    forming a heater structure above a semiconductor substrate;
    depositing an insulating layer above the heater structure;
    etching an opening in the insulating layer to expose a portion of the heater structure;
    depositing phase change material on the insulating layer such that said phase change material is in contact with the heater structure at the opening;
    depositing a barrier layer above the phase change material;
    etching the barrier layer to remove a first portion thereof and to leave a second portion thereof; and
    using the second portion of the baffler layer as a mask to etch the phase change layer and the heater structure.

14. A process according to 13 wherein said mask is used in etching a mold layer.

15. A process according to 13 wherein said mask is used in etching an adhesion layer.

16. A process, comprising:
    forming a heater structure above a semiconductor substrate;
    depositing an insulating layer above the heater structure;
    etching an opening in the insulating layer to expose a portion of the heater structure;
    depositing phase change material on the insulating layer such that said phase change material is in contact with the heater structure at the opening;
    forming a mask above the phase change material;
    using the mask to define the phase change material into a defined shape and size; and
    etching the insulating layer and then the heating structure according to the defined shape and size of the phase change material.

17. A process according to 16, further comprising:
    forming a barrier layer on the phase change material and below the mask; and
    using the mask to define the barrier layer by removing a first portion of the barrier layer and leaving a second portion of the baffler layer, wherein using the mask to define the phase change material includes using the mask and second portion of the barrier layer as a combined mask to define the phase change material into the defined shape and size.

18. A process according to 16, further comprising:
    forming an adhesion layer on the insulating layer and below at least a portion of the phase change material; and
    etching the adhesion layer according to the defined shape and size of the phase change material.

* * * * *

UNITED STATES PATENT AND TRADEMARK OFFICE
CERTIFICATE OF CORRECTION

PATENT NO. : 7,422,926 B2
APPLICATION NO. : 11/445924
DATED : September 9, 2008
INVENTOR(S) : Fabio Pellizzer et al.

It is certified that error appears in the above-identified patent and that said Letters Patent is hereby corrected as shown below:

Column 10
Line 16, "using the second portion of the baffler layer as a mask" should read as
-- using the second portion of the barrier layer as a mask --

Line 31, "using the second portion of the baffler layer as a mask" should read as
-- using the second portion of the barrier layer as a mask --

Line 56, the section "portion of the baffler layer, wherein using the mask" should read as -- portion of the barrier layer, wherein using the mask --

Signed and Sealed this

Fourth Day of August, 2009

JOHN DOLL
*Acting Director of the United States Patent and Trademark Office*